United States Patent
Padilla, Jr. et al.

(10) Patent No.: US 11,126,495 B2
(45) Date of Patent: Sep. 21, 2021

(54) DYNAMIC ERROR HANDLING IN A MEMORY SYSTEM

(71) Applicant: Micron Technology, Inc., Boise, ID (US)

(72) Inventors: Renato Padilla, Jr., Folsom, CA (US); Gary F. Besinga, Boise, ID (US); Harish Singidi, Fremont, CA (US); Gianni Stephen Alsasua, Rancho Cordova, CA (US); Ashutosh Malshe, Fremont, CA (US); Kishore Kumar Muchherla, Fremont, CA (US); Vamsi Pavan Rayaprolu, San Jose, CA (US); Sampath Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 15/914,858

(22) Filed: Mar. 7, 2018

(65) Prior Publication Data
US 2019/0278653 A1 Sep. 12, 2019

(51) Int. Cl.
*G06F 11/07* (2006.01)
*G06F 11/30* (2006.01)

(52) U.S. Cl.
CPC ...... *G06F 11/0793* (2013.01); *G06F 11/0727* (2013.01); *G06F 11/0751* (2013.01); *G06F 11/3034* (2013.01); *G06F 11/3072* (2013.01)

(58) Field of Classification Search
None
See application file for complete search history.

(56) References Cited

U.S. PATENT DOCUMENTS

| | | | | |
|---|---|---|---|---|
| 4,843,567 A | * | 6/1989 | Mukherjee | G06N 5/003 706/46 |
| 6,487,677 B1 | * | 11/2002 | Jantz | G06F 11/0748 714/2 |
| 2003/0145249 A1 | * | 7/2003 | Wilson | H04L 41/0631 714/25 |
| 2008/0214299 A1 | * | 9/2008 | Smith | G07F 17/32 463/29 |
| 2009/0259749 A1 | * | 10/2009 | Barrett | G06F 11/3495 709/224 |
| 2014/0372830 A1 | * | 12/2014 | Morgan | G06F 11/10 714/764 |
| 2016/0026526 A1 | * | 1/2016 | Zhang | G06F 11/1068 714/764 |
| 2016/0147631 A1 | * | 5/2016 | Magdon-Ismail | G06F 11/3485 718/100 |
| 2016/0196195 A1 | * | 7/2016 | Chang | G06F 11/1482 714/6.3 |
| 2016/0274966 A1 | * | 9/2016 | Garvey | G06F 11/0706 |

(Continued)

*Primary Examiner* — Matthew M Kim
*Assistant Examiner* — Matthew N Putaraksa
(74) *Attorney, Agent, or Firm* — Schwegman Lundberg & Woessner, P.A.

(57) ABSTRACT

A system configured to determine that a trigger condition has occurred that is related to an operation performed on a memory device of the system. Responsive to determining that the trigger condition has occurred, reordering error handling mechanisms of an error handling sequence based upon an error handling mechanism performance metric. Each error handling mechanism specifies operations to be performed to recover an error in the operation on the memory device.

26 Claims, 4 Drawing Sheets

(56) References Cited

U.S. PATENT DOCUMENTS

| | | | | |
|---|---|---|---|---|
| 2016/0321588 A1* | 11/2016 | Das | ................ | G06Q 10/06315 |
| 2018/0227078 A1* | 8/2018 | Dropps | ................ | H04L 1/0042 |
| 2018/0239660 A1* | 8/2018 | Guha | ................ | G06F 11/0751 |
| 2018/0365103 A1* | 12/2018 | Li | ................ | G06F 11/1076 |
| 2020/0192742 A1* | 6/2020 | Boettcher | ............... | G06F 9/226 |

* cited by examiner

DYNAMIC ERROR HANDLING IN A MEMORY SYSTEM

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

BRIEF DESCRIPTION OF THE DRAWINGS

The present disclosure is illustrated by way of example and not limitation in the figures of the accompanying drawings, in which like references indicate similar elements.

DETAILED DESCRIPTION

Figure 1:
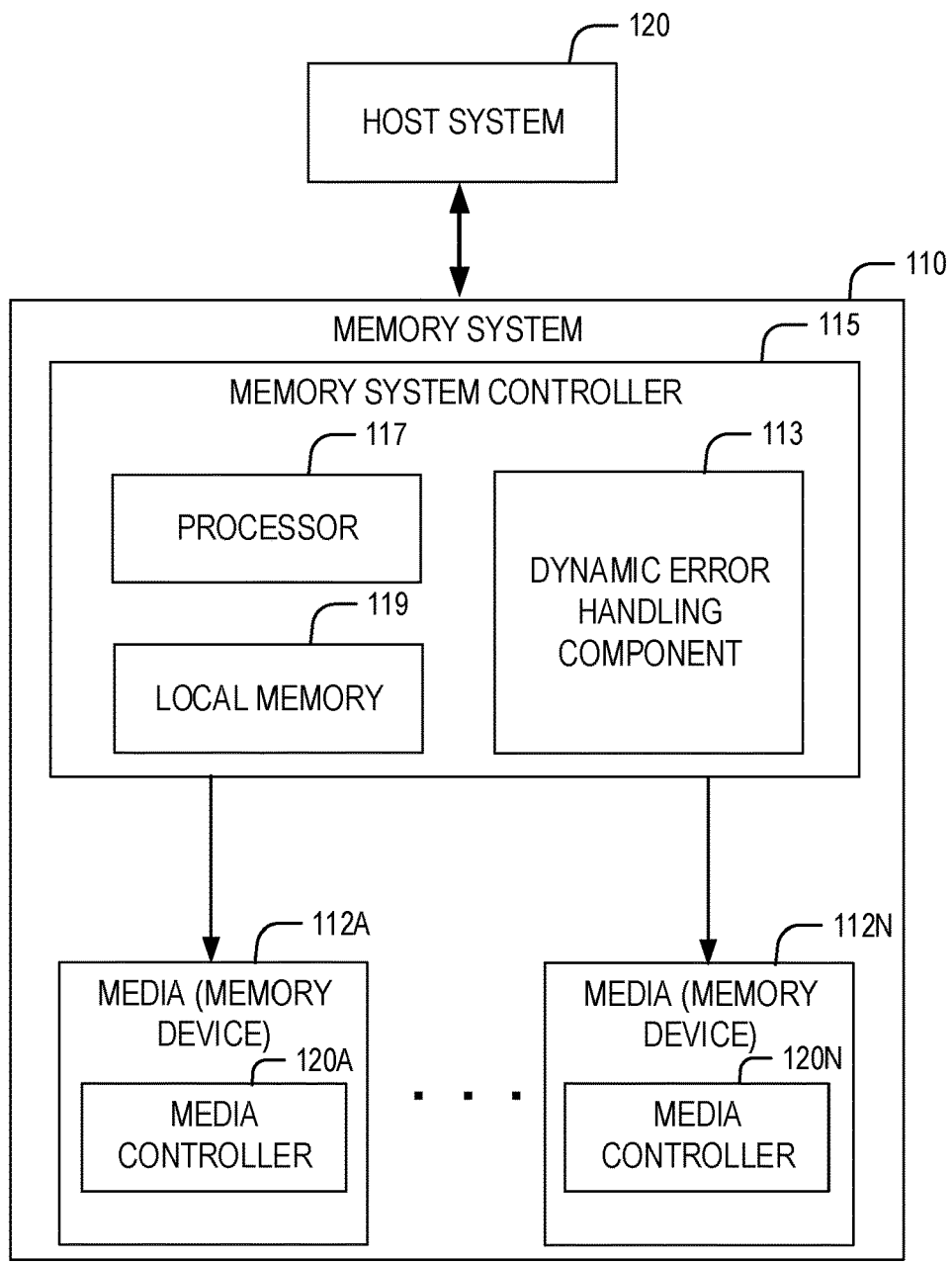
FIG. 1 illustrates an example computing environment including a memory system, in accordance with some examples of the present disclosure.

Aspects of the present disclosure are directed to dynamic error handling in a memory system. An example of a memory system is a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, negative-and (NAND). The host system can provide write requests to store data at the memory devices of the memory system and can provide read requests to retrieve data stored at the memory system.

Memory devices, such as FLASH-based devices, may experience one or more errors during operation. For example, the memory cells may degrade due to the repeated reading, writing, and erasing of memory cells. Likewise, errors may be introduced in the operation of the memory system. For example, read-disturb errors happen when a pass-through voltage (Vpass) is applied to memory cells near a memory cell that is being read. This Vpass voltage shifts the distribution of charge in the cells to which it is applied. If the magnitude of the distribution is great enough, it may cause a different value to be read from the memory cell than what was stored.

To ensure reliable data storage and recovery, a memory system may have one or more error detection and one or more error correction mechanisms. For example, memory cells may have Error Correction Codes (ECC) that are generated when the memory cell is written by inputting the value to be stored in the memory device into a mathematical formula to produce an ECC value that is also stored. Later, upon reading the memory cell, the same or complimentary mathematical formula is applied to the value read from the memory cell. The ECC generated at the time the value is written to the memory cell is compared to the ECC generated at the time the value is read from the memory cell to determine an error. For example, if the ECC generated at the time the value is written to the memory device does not match the ECC generated at the time the value is read from the memory device, then the memory cell has experienced an error. Example ECC processes may include parity checks, Hamming codes, checksums, cyclic redundancy checks (CRCs), cryptographic hashes, block codes, convolutional codes, turbo codes, low-density parity check (LDPC) and the like.

A variety of error handling mechanisms may allow a memory device to correct the value read from the memory cell when an error is detected. Error handling mechanisms may be hardware or software based procedures used by a memory system to attempt to correct an error. Error handling mechanisms may be general error handling mechanisms that may work on all types of errors or may be targeted to correct certain error conditions in the memory system. For example, read-disturb error handling mechanisms are targeted to recovering read-disturb errors. One example error handling mechanism used to correct read-disturb errors is shifting the read voltage to a higher voltage to compensate for the shift in charge distribution. Multiple error handling mechanisms may be tried for a given error. For example, there may be multiple error handling mechanisms that are targeted to fixing read-disturb errors. Each error handling mechanism may perform different operations and thus may cost a different amount in error handling overhead.

In some examples, it may not be evident to the memory system what the error is. The memory system may simply know that an error detection mechanism (such as an ECC) detected an error. Because there may be multiple error handling mechanisms for a given problem, and because the error cause may be unknown, the memory system may try multiple error handling mechanisms to correct the error. In some examples, the memory system may try one or more of these correction mechanisms in an order specified by a predefined error handling sequence. Error handling sequences may be programmed into the device in hardware, software, or a combination of hardware and software at device manufacture time.

The error handling sequence is developed by the manufacturer based upon expected use cases and environments as well as historical expected success rates, latencies, and controller utilization statistics of the various error handling mechanisms. The predefined error handling sequence amounts to an educated guess by the memory system designers of the best sequence for correcting errors given the time and resource costs associated with each particular error handling mechanism and the expected error types associated with the expected use cases.

Having predefined error handling sequences is inflexible and leads to sub-optimal results. The error handling sequence may be designed for a set of use cases and environments which might not be accurate. For example, memory systems that are incorporated in mobile phones may be designed for certain data use patterns, situations, and environmental conditions. Thus, a first error handling mechanism designed to correct certain errors thought to be common to these environments or use cases may be run first. The release of a popular new application for a mobile phone may change the way the memory system is used and render the previous handling sequences sub-optimal. For example, the first error handling mechanism may not correct the types of errors experienced under this new type of use case very often, leading to delay and wasted resources.

Disclosed herein are some examples of memory systems which are configured to reorder error handling sequences during device usage based upon one or more observed error handling metrics. An optimal sequence may be determined based upon the one or more observed error handling metrics and a reordering algorithm. This may allow the actual usages of the memory system to dictate how errors are handled to provide a more flexible and efficient process. The error handling sequence may be reordered periodically, or in response to a triggering condition. Triggering conditions may include one or more metrics being compared to a threshold (e.g., over, equal to or under a specified threshold), a number of error conditions, a request from a host device, or the like. Example error handling metrics include a total number of times the memory device experienced an error, latency metrics for each error handling mechanism, a success rate metric for each error handling mechanism, and the like.

In some examples, the reordering algorithm determines how the error handling mechanisms are reordered in the error handling sequence given the observed error handling metrics. For example, the reordering algorithm may include a formula that scores each error handling mechanism based upon the error handling metrics and orders them according to the score (e.g., highest score to lowest score or lowest score to highest score). The reordering algorithm may be predetermined and may be static. In other examples, a host may program a new reordering algorithm.

As an example, the reordering algorithm may score each error handling mechanism by multiplying a calculated failure rate (e.g., calculated as 1—the success rate) by the latency. The success rate may be the number of times the error handling mechanism succeeded in correcting an error on a memory device during operation. The sequence may be reordered in a lowest score to a highest score order. Reordering the error handling sequence based upon an observed failure rate and the latency produces an ordering reducing (ideally minimizing) the expected costs of the error handling sequence.

As an example, a table is shown below listing a sample of the latency, failure rate, error handling metric, a current order, and a new order calculated based upon the above disclosed reordering algorithm:

| Mechanism | Latency | Failure Rate | EH Metric (F * L) | Current Order | New Order |
|---|---|---|---|---|---|
| EH_A | 100 | 0.5 | 50 | 1 | 3 |
| EH_B | 300 | 0.2 | 60 | 2 | 4 |
| EH_C | 100 | 0.1 | 10 | 3 | 1 |
| EH_D | 150 | 0.2 | 30 | 4 | 2 |

As noted, in some examples, the memory system may track one or more error handling metrics. Some of these metrics may be based upon other metrics that are tracked. For example, every time the memory system enters an error handling sequence, a counter (EH_COUNTER) may be incremented. Each error handling mechanism may also have an individual counter Px that is incremented if that mechanism corrected the error. In these examples, the success rate metric of each error handling mechanism x may be defined as:

$$S_x = P_x / EH\_COUNTER$$

In the above example, EH_COUNTER is a count of every time the error handling sequence is entered. Thus, even if a particular error handling mechanism was never called, if it was not the error handling mechanism that corrected the error, it may be counted as a failure. While this favors simplicity, in some examples, a more accurate calculation of a success rate may be made that utilizes a counter $EH\_COUNTER_x$ that counts each time a particular error handling mechanism was run.

In some examples, one or more of the metrics may be weighted. For example, the latency may be weighted by a first weight and the failure rate may be weighted by a second weight, wherein the first and second weights may be different. The weights may predetermined, or may be determined by the memory device, a host, or another computing device. For example, the error handling metrics may be input to a machine learning model either on the memory device, on a host device, or another computing device. The machine learning model may adjust the weights to reduce (ideally minimize) a total error handling latency based upon the actual error handling metrics. Example machine learning algorithms include a logistic regression or linear regression.

FIG. 1 illustrates an example computing environment 100 including a memory system 110, in accordance with some examples of the present disclosure. The memory system 110 can include media, such as memory devices 112A to 112N. The memory devices 112A to 112N can be volatile memory devices, non-volatile memory devices, or a combination of such. In some embodiments, the memory system is a storage system. An example of a storage system is an SSD. In some embodiments, the memory system 110 is a hybrid memory/storage system. In general, the computing environment 100 can include a host system 120 that uses the memory system 110. In some implementations, the host system 120 can write data to the memory system 110 and read data from the memory system 110.

The host system 120 can be a computing device such as a desktop computer, laptop computer, network server, mobile device, or such computing device that includes a memory and a processing device. The host system 120 or the memory system 110 can be included in a variety of products, such as IoT devices (e.g., a refrigerator or other appliance, sensor, motor or actuator, mobile communication device, automobile, drone, etc.) to support processing, communications, or control of the product. The host system 120 can include a processor, a memory card reader, or one or more other electronic devices external to the memory system 110. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), an eMMC™ interface, etc. The physical host interface can be used to transmit data between the host system 120 and the memory system 110. The host system 120 can further utilize an NVM Express (NVMe)

interface to access the memory devices 112A to 112N when the memory system 110 is coupled with the host system 120 by the PCIe interface. The physical host interface can provide an interface for passing control, address, data, and other signals between the memory system 110 and the host system 120.

The memory system 110 is shown, by way of example, to include the memory system controller 115 and media, such as memory devices 112A to 112N. The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 320 can be grouped as a number of devices, planes, sub-blocks, blocks, or pages that can refer to a unit of the memory device used to store data.

In an example, the memory system 110 may be a discrete memory and/or storage device component of the host system 120. In other examples, the memory system 110 may be a portion of an integrated circuit (e.g., system on a chip (SOC), etc.), stacked or otherwise included with one or more other components of the host system 120.

Each of the media devices 112A to 112N can include a media controller (e.g., media controllers 130A to 130N) to manage the memory cells of the memory devices 112A to 112N.

The memory system 110 can include a memory system controller 115 that can communicate with the memory devices 112A to 112N to perform operations such as reading data, writing data, or erasing data at the memory devices 112A to 112N and other such operations. The memory system controller 115 can include hardware such as one or more integrated circuits and/or discrete components, a buffer memory, or a combination thereof. The memory system controller 115 can be a microcontroller, special purpose logic circuitry (e.g., a field programmable gate array (FPGA), an application specific integrated circuit (ASIC), etc.), or other suitable processor. The memory system controller 115 can include a processor (processing device) 117 configured to execute instructions stored in local memory 119. In the illustrated example, the local memory 119 of the memory system controller 115 includes an embedded memory configured to store instructions for performing various processes, operations, logic flows, and routines that control operation of the memory system 110, including handling communications between the memory system 110 and the host system 120. In some embodiments, the local memory 119 can include memory registers storing, e.g., memory pointers, fetched data, etc. The local memory 119 can also include read-only memory (ROM) for storing micro-code. While the example memory system 110 in FIG. 1 has been illustrated as including the memory system controller 115, in another embodiment of the present disclosure, a memory system 110 may not include a memory system controller 115, and may instead rely upon external control (e.g., provided by an external host, or by a processor or controller separate from the memory system).

In general, the memory system controller 115 can receive commands or operations from the host system 120 and can convert the commands or operations into instructions or appropriate commands to achieve the desired access to the memory devices 112A to 112N. The memory system controller 115 can be responsible for other operations such as wear leveling operations (e.g., garbage collection operations, reclamation), error detection and error-correcting code (ECC) operations, encryption operations, caching operations, block retirement, and address translations between a logical block address and a physical block address that are associated with the memory devices 112A to 112N. The memory system controller 115 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The memory system controller 115 can include a set of management tables to maintain various information associated with one or more components of the memory system 110. For example, the information can be associated with a memory device 112A to 112N or one or more memory cells coupled to the memory system controller 115. For example, the management tables may include information regarding block age, block erase count, error history, or one or more error counts (e.g., a write operation error count, a read bit error count, a read operation error count, an erase error count, etc.) for one or more blocks of memory cells coupled to the memory system controller 115. In certain examples, if the number of detected errors for one or more of the error counts is above a threshold, then the bit error may be referred to as an uncorrectable bit error. The management tables can maintain a count of correctable or uncorrectable bit errors, among other things.

The memory system controller 115 can detect or correct errors associated with writing data to or reading data from one or more memory cells of the memory devices 112A to 112N. The memory system controller 115 can actively detect and recover from error occurrences (e.g., bit errors, operation errors, etc.) associated with various operations or storage of data, while maintaining integrity of the data transferred between the host system 120 and the memory system 110, or maintaining integrity of stored data (e.g., using redundant array of independent disks (RAID) storage, etc.), and may remove (e.g., retire) failing memory resources (e.g., memory cells, memory arrays, pages, blocks, etc.) to prevent future errors.

The memory system controller 115 can calculate an ECC upon writing a value to the memory devices 112A to 112N and stores this value in a different location in the memory devices 112A to 112N. Upon reading a value from the memory devices 112A to 112N, the memory system controller 115 can calculate an ECC value for the value read and compare that to the stored ECC value. If the ECC values do not match, the memory system controller 115 can determine that an error has occurred. The memory system controller 115 can execute one or more error handling mechanisms in an order specified according to an error handling sequence in an attempt to correct the error. The error handling sequence can be stored in a data structure on a component of the memory system 110. The memory system controller 115 can continue trying error handling mechanisms until either the error is corrected or there are no more error handling sequences.

The memory system controller 115 can track one or more error handling metrics. Examples include one or more of the number of times the error handling mechanisms are needed (e.g., EH_COUNTER), the number of times each particular error handling metric is utilized, the number of times each error handling mechanism successfully fixes an error, a latency of each error handling mechanism, and the like. In some examples, the memory system controller 115 tracks an overall latency—that is, how much time the system utilizes correcting errors each time it needs to correct errors. The collected metrics can be stored in a same or different data structure as the error handling sequence.

The memory system 110 can include a dynamic error handling component 113 (e.g., circuitry, dedicated logic, programmable logic, firmware, etc.) to perform the operations described herein. In some implementations, the error handling component 113 can reorder error handling sequences during device usage based upon one more observed error handling metrics. The dynamic error handling component 113 monitors the metrics to determine if a trigger to rearrange the order of the error handling mechanisms has occurred.

In some examples, the trigger may be a number of times the error handling sequence has been initiated exceeding a predetermined threshold. In some other examples, other metrics may be utilized in addition to, or instead of, the EH_COUNTER exceeding a threshold. For example, if the overall latency of the error handling sequence (e.g., the time it takes to correct an error) exceeds a predetermined threshold, or has been trending upward over a predetermined period of time, this suggests that the order of the error handling sequence is not optimal. In some examples, the trigger condition may be EH_COUNTER exceeding a threshold and the overall latency exceeding a predetermined threshold or trending upward over a predetermined period of time. One of ordinary skill in the art will appreciate that other memory device performance metrics may be utilized as trigger conditions.

If the dynamic error handling component 113 determines that a trigger condition is present, the dynamic error handling component 113 can update the error handling sequence based upon the error handling metrics and a reordering algorithm. For example, the dynamic error handling component 113 calculates the scores for one or more error correction mechanisms. In some examples, the order of execution of one or more of the error handling mechanisms in the error handling sequence may be modified based upon the scores. For example, the error handling mechanisms may be ordered from highest to lowest or lowest-to-highest, depending on the metrics utilized and the way the score is calculated.

The memory system 110 can also include additional circuitry or components that are not illustrated. In some implementations, the memory system 110 can include a cache or buffer (e.g., DRAM) and address circuitry (e.g., a row decoder and a column decoder) that can receive an address from the controller 115 and decode the address to access the memory devices 112A to 112N.

Figure 2:
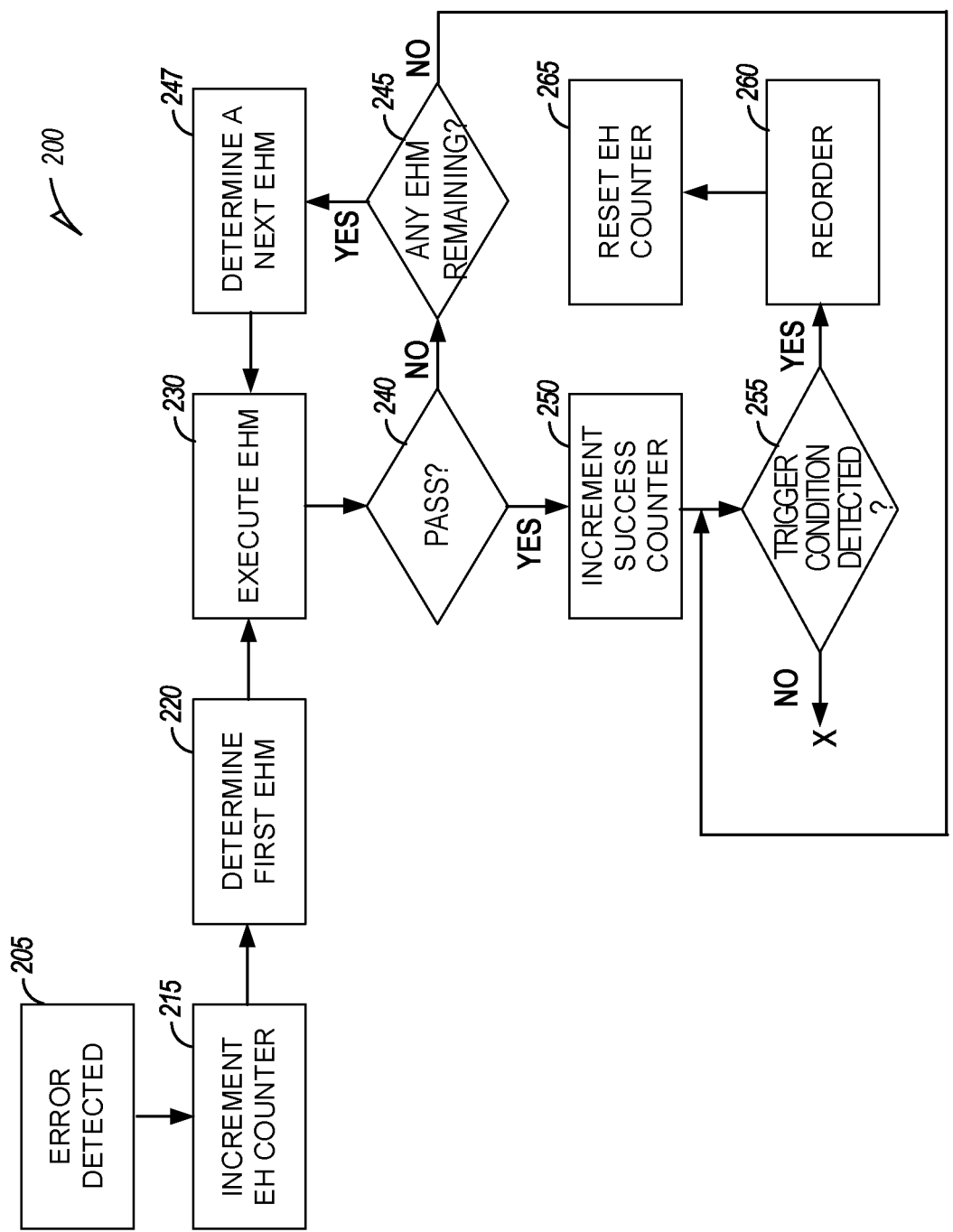
FIG. 2 is a flow diagram of an example method to dynamically reorder an error handling sequence, in accordance with some implementations of the present disclosure.
Figure 3:
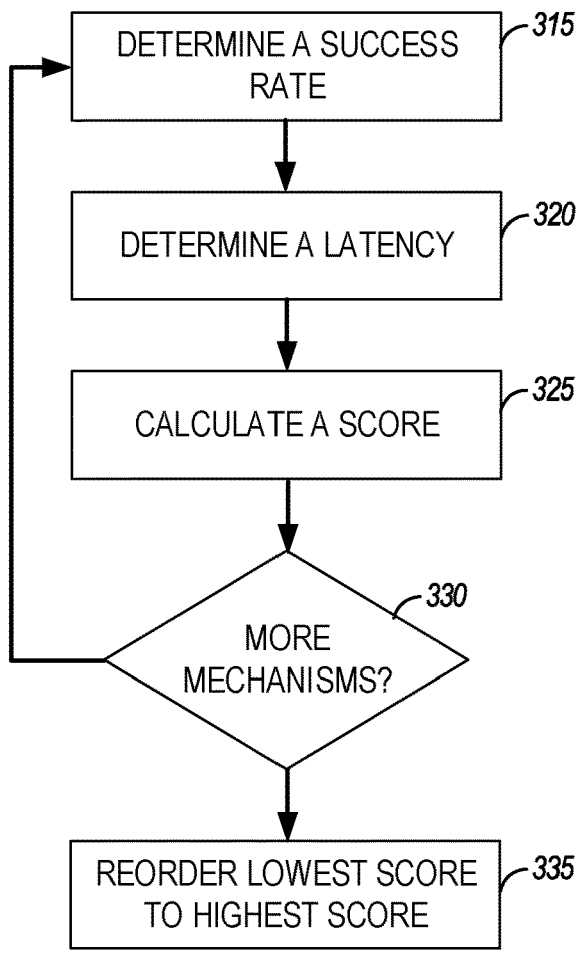
FIG. 3 is a flow diagram of an example method for evaluating error handling mechanisms for reordering an error handling sequence in accordance with some implementations of the present disclosure.

FIG. 2 and FIG. 3. are flow diagrams of example methods in accordance with some implementations of the present disclosure. Although shown in a particular sequence or order, unless otherwise specified, the order of the processes can be modified. Thus, the illustrated implementations should be understood only as examples, and the illustrated processes can be performed in a different order, and some processes can be performed in parallel. Additionally, one or more processes can be omitted in various embodiments. Thus, not all processes are required in every implementation. Other process flows are possible.

FIG. 2 is a flow diagram of an example method 200 to dynamically reorder an error handling sequence in accordance with some implementations of the present disclosure. Method 200 can be performed by processing logic that can include hardware (e.g., circuitry, dedicated logic, programmable logic, microcode, etc.), software (such as instructions run on a processing device), firmware, or a combination thereof. In one embodiment, the dynamic error handling component 113 of a processing device (e.g., controller 115) in FIG. 1 can perform method 200.

At block 205, processing device detects an error. The error can be detected, for example, using one or more error detection mechanisms. The error can be related to a read operation where the ECC code that is calculated from the value that is read from one or more memory cells is different than the ECC code that was calculated when the value was written.

At block 215, processing device increments an error handling counter (EH_COUNTER). The error handling counter can count the number of times that the error handling sequence has been performed since the last time the error handling sequence was reordered. The error handling counter can be implemented in software or hardware.

At block 220, processing device determines a first error handling mechanism (EHM) of the error handling sequence. For example, the processing device can load the error handling sequence, which may list an ordered sequence of error handling mechanisms. The sequence lists the execution order of the error handling mechanisms utilized until either there are no more error handling mechanisms (the error is uncorrectable) or the error is corrected, as described in more detail below. The error handling sequence can be a list of error handling mechanisms and can have pointers to executable code in firmware of the memory system for performing the error handling mechanisms in the list. The memory system can have a pointer or index that can track which error handling mechanisms have already been tried. In the case of block 220, since no other error handling mechanisms have been tried, the first error handling mechanism in the sequence is retrieved.

At block 230, processing device executes the first error handling mechanism. For example, one or more code, firmware, or hardware modules can attempt to correct the error. Example error handling mechanisms can include shifting a read voltage, applying an increased read voltage, re-reading the memory cells, auto read calibration, intensive error correction capabilities and the like. Example intensive error corrections include a soft bit read.

At block 240, processing device determines whether the error handling mechanism succeeded in correcting the error (e.g., whether the error handling mechanism passed). If the error was not corrected (block 240), then processing device determines whether there are any error handling mechanisms in the error handling sequence that remain to be tried at block 245.

If there are any error handling mechanisms remaining (block 245), processing device determines a next error handling mechanism at block 247. For example, the memory system can have a pointer, an index, or some other method of tracking the next error handling mechanism in the error handling sequence. At block 230, processing device executes the next error handling mechanism.

If there are no other error handling mechanisms (block 245), then processing device determines that the error is uncorrectable and determine whether a trigger condition is detected at block 255, as described in greater detail below.

If a determination is made at block 240 that the error handling mechanism has corrected the error, processing device increments a success counter for the mechanism that succeeded at block 250. The counter can be stored (e.g., as part of a table) as part of the data structure storing the error handling sequence, or can be stored in a separate data structure.

At block 255, processing device determines whether a trigger condition for triggering a reordering of the error handling sequence has occurred. Triggering conditions can be a condition which is defined that triggers a reordering of the error handling mechanisms in the error handling sequence. Triggering conditions can be based upon comparisons to statistics tracked by the dynamic error handling component 113 (e.g., when the EH_COUNTER exceeds a threshold), the occurrence of one or more events (e.g., an uncorrectable error), a host command, or the like. The triggering conditions can be predetermined in a firmware and can be static (e.g., not changed) or can be updated by a firmware update, an instruction from a host device, or the like. In some examples, the triggering condition can be whether the EH_COUNTER is above a threshold amount. Ensuring that EH_COUNTER is above a threshold may ensure that the memory system has accumulated enough data (e.g., in the form of success rates for the various error handling mechanisms) such that the reordering produces good results. While the triggering condition is detected as part of executing the error handling sequence, in other examples, the triggering condition can be checked for at other times.

At block 260, processing device reorders the error handling sequence according to a reordering algorithm. For example, processing device reorders the error handling sequence based upon one or more error handling metrics, such as, for example, a success or failure rate of one or more error handling mechanisms; a latency of the error handling mechanisms (either as determined during runtime, or the expected latency when manufactured); and the like. One example of reordering the error handling sequence is described in greater detail below in conjunction with FIG. 3. In some implementations, at block 265, processing device resets the error handling counter (e.g., EH_COUNTER).

FIG. 3 is a flow diagram of an example method 300 for evaluating error handling mechanisms for reordering an error handling sequence in accordance with some implementations of the present disclosure. Method 300 can be performed by processing logic that can include hardware (e.g., circuitry, dedicated logic, programmable logic, microcode, etc.), software (such as instructions run on a processing device), firmware, or a combination thereof. In one embodiment, the dynamic error handling component 113 of a processing device (e.g., controller 115) in FIG. 1 can perform method 300. FIG. 3 shows one example reordering algorithm. One of ordinary skill in the art having the benefit of the present disclosure will appreciate that other algorithms may be utilized. Operations 315-330 can be performed for each particular error handling mechanism of a set of error handling mechanisms.

At block 315, the processing device determines a success rate of the particular error handling mechanism. The success rate can be determined from metrics kept during operation of the error handling sequence. As described in FIG. 2, in some examples, each time the error handling mechanism is triggered, a counter (e.g., the EH_COUNTER) is incremented. Additionally, each time a particular error handling mechanism corrects the error, a counter for that error handling mechanism may be incremented. In some examples, the success rate of the error handling mechanism is a count of the number of times the error handling mechanism was successful divided by the EH_COUNTER. As previously noted, EH_COUNTER may be a global counter that tracks the number of times the error handling sequence was entered, but in other examples, each error handling mechanism may utilize a dedicated EH_COUNTER that counts the number of times that particular error handling mechanism was executed.

At block 320, processing device determines a latency for the particular error handling mechanism. In some examples, the latency may be preprogrammed into the memory system at manufacture as an estimated latency for the particular error handling mechanism. In other examples, the latency may be measured by the memory system from previous operations where the error handling mechanism was run—e.g., at operation 230 from FIG. 2. In examples in which the latency is an actual measured latency, a maximum, minimum, or average latency of all of the collected latencies may be utilized. The latency measurements may be stored in storage, and averages or minimums and maximums may be determined at operation 220 of FIG. 2. Determining a latency may then include retrieving it from nonvolatile storage, retrieving it from volatile storage, retrieving it as part of a firmware object, or the like.

At block 325, processing device uses the latency and success rate to calculate a score for the error handling mechanism. For example, the success rate may be converted to a failure rate by subtracting the success rate from 1. Thus, the failure rate=1−success rate. The score may then be the latency times the failure rate.

At block 330, if there are more error handling mechanisms that are to be evaluated, the operations of 315-330 can be repeated for those error handling mechanisms.

At block 335, once the error handling mechanisms are evaluated (e.g., scored), the processing device reorders the error handling sequence such that the error handling mechanisms are ordered based on the scores. For example, the error handling mechanisms are ordered from lowest to highest score in the error handling sequence.

By utilizing a dynamic reordering of the error handling sequence, the error handling sequence of the memory system may be tailored to the actual conditions and errors experienced by the memory system. In example embodiments this may allow enhanced performance of the memory system.

Figure 4:
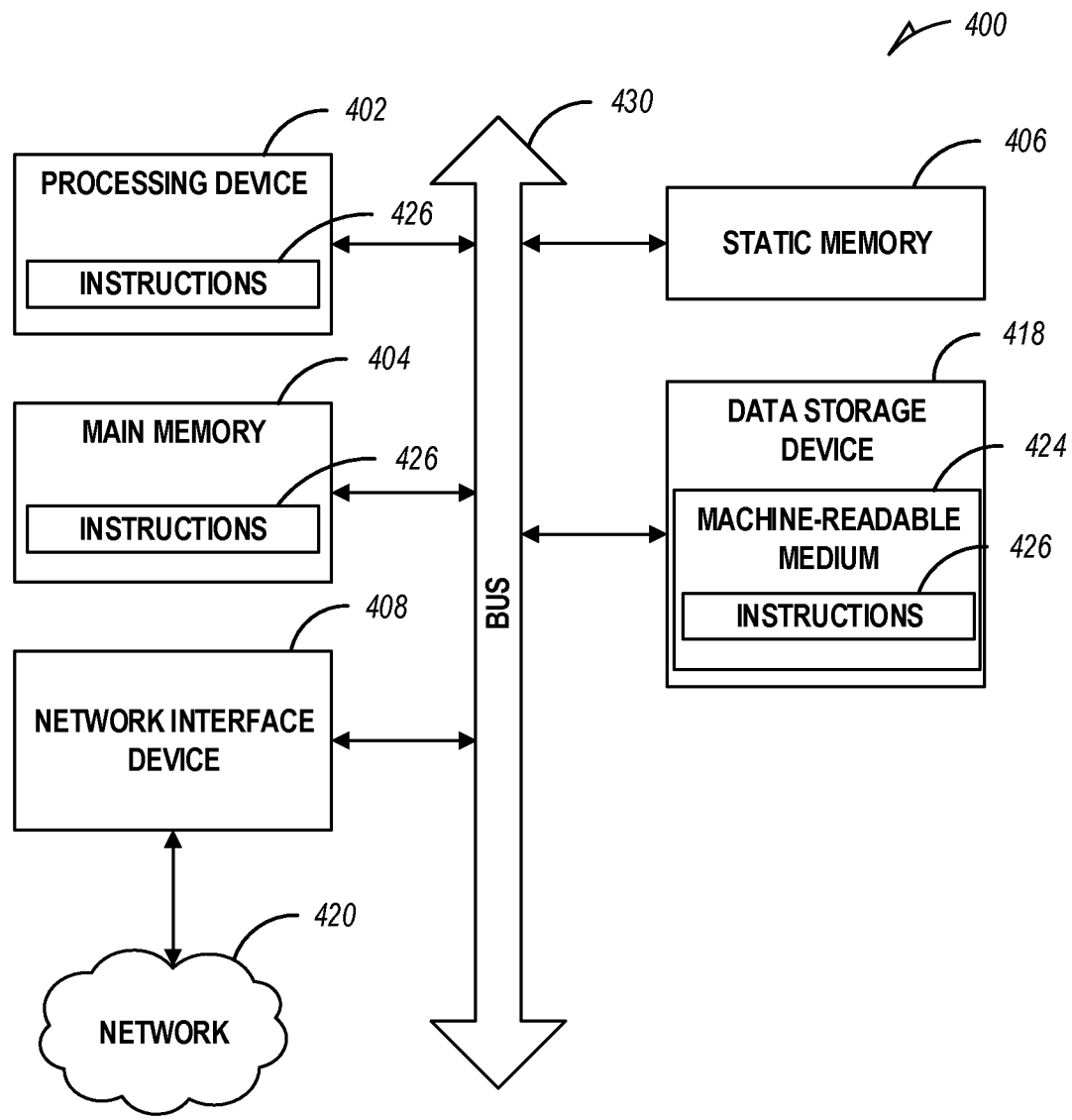
FIG. 4 is a block diagram illustrates a diagrammatic representation of a machine in the form of a computer system within which a set of instructions may be executed for causing the machine to perform any one or more of the methodologies discussed herein, according to examples of the present disclosure.

FIG. 4 illustrates an example machine of a computer system 400 within which a set of instructions, for causing the machine to perform any one or more of the methodologies discussed herein, can be executed. In some implementations, the computer system 400 can correspond to a host system (e.g., the host system 120 of FIG. 1) that includes or utilizes a memory system (e.g., the memory system 110 of FIG. 1) or can be used to perform the operations of a controller (e.g., to execute an operating system to perform operations corresponding to the dynamic error handling component 113 of FIG. 1). In alternative implementations, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable storage medium 424 (also known as a computer-readable medium) on which is stored one or more sets of instructions or software 426 embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory system 110 of FIG. 1.

In one implementation, the instructions 426 include instructions to implement functionality corresponding to a write parameter handler (e.g., the dynamic error handling component 113 of FIG. 1). While the machine-readable storage medium 424 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some implementations, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications can be made thereto without departing from the broader spirit and scope of implementations of the disclosure as set forth in the following claims. The specification and drawings are, accordingly, to be regarded in an illustrative sense rather than a restrictive sense.

OTHER NOTES AND EXAMPLES

Example 1 is a memory device comprising: a controller configured to perform operations comprising: determining that a trigger condition has occurred that is related to an operation of the memory device; and responsive to determining that the trigger condition has occurred, reordering a plurality of error handling mechanisms of an error handling sequence based upon an error handling mechanism performance metric, each error handling mechanism specifying operations to be performed by the controller to recover an error in the operation of the memory device.

In Example 2, the subject matter of Example 1 optionally includes wherein the error handling mechanism performance metric comprises a latency measurement specifying a length of time each of the plurality of error handling mechanisms takes to execute.

In Example 3, the subject matter of Example 2 optionally includes wherein the operations of reordering the plurality of error handling mechanisms of an error handling sequence based upon an error handling mechanism performance metric comprises reordering the plurality of error handling mechanisms of an error handling sequence based upon both the latency and a failure rate for each of the plurality of error handling mechanisms.

In Example 4, the subject matter of Example 3 optionally includes wherein the operations of reordering the error handling sequence comprises: for each particular one of the plurality of error handling mechanisms: calculating a failure rate of the particular one of the plurality of error handling mechanisms; and determining a score of the particular one of the plurality of error handling mechanisms by multiplying the failure rate by a corresponding latency of the particular one of the plurality of error handling mechanisms; and reordering the error handling sequence by ordering the plurality of error handling mechanisms in order of increasing score such that a lowest scoring error handling mechanism is performed first.

In Example 5, the subject matter of any one or more of Examples 1-4 optionally include wherein the operations further comprise: subsequent to reordering the error handling sequence, determining that an error has occurred reading a value from a memory of the memory device; and applying ones of the plurality of error handling mechanisms in the sequence specified by the error handling sequence until either the error is corrected or until it is determined that the error is uncorrectable.

In Example 6, the subject matter of Example 5 optionally includes wherein the operations further comprise: determining that a particular one of the plurality of error handling mechanisms corrected the error; and in response, incrementing a counter corresponding to the particular one of the plurality of error handling mechanisms.

In Example 7, the subject matter of any one or more of Examples 1-6 optionally include wherein the trigger condition is a number of times that the error handling sequence is utilized.

Example 8 is a method performed by a controller of a memory device, the method comprising: determining that a trigger condition has occurred that is related to an operation of the memory device; and responsive to determining that the trigger condition has occurred, reordering a plurality of error handling mechanisms of an error handling sequence based upon an error handling mechanism performance metric, each error handling mechanism specifying operations to be performed by the controller to recover an error in the operation of the memory device.

In Example 9, the subject matter of Example 8 optionally includes wherein the error handling mechanism performance metric comprises a latency measurement specifying a length of time each of the plurality of error handling mechanisms takes to execute.

In Example 10, the subject matter of Example 9 optionally includes wherein the reordering the plurality of error handling mechanisms of an error handling sequence based upon an error handling mechanism performance metric comprises reordering the plurality of error handling mechanisms of an error handling sequence based upon both the latency and a failure rate for each of the plurality of error handling mechanisms.

In Example 11, the subject matter of Example 10 optionally includes wherein reordering the error handling sequence comprises: for each particular one of the plurality of error handling mechanisms: calculating a failure rate of the particular one of the plurality of error handling mechanisms; and determining a score of the particular one of the plurality of error handling mechanisms by multiplying the failure rate by a corresponding latency of the particular one of the plurality of error handling mechanisms; and reordering the error handling sequence by ordering the plurality of error handling mechanisms in order of increasing score such that a lowest scoring error handling mechanism is performed first.

In Example 12, the subject matter of any one or more of Examples 8-11 optionally include subsequent to reordering the error handling sequence, determining that an error has occurred reading a value from a memory of the memory device; and applying ones of the plurality of error handling mechanisms in the sequence specified by the error handling sequence until either the error is corrected or until it is determined that the error is uncorrectable.

In Example 13, the subject matter of Example 12 optionally includes determining that a particular one of the plurality of error handling mechanisms corrected the error; and in response, incrementing a counter corresponding to the particular one of the plurality of error handling mechanisms.

In Example 14, the subject matter of any one or more of Examples 8-13 optionally include wherein the trigger condition is a number of times that the error handling sequence is utilized.

Example 15 is a machine-readable medium, comprising instructions, which when performed by a machine, cause the machine to perform operations comprising determining that a trigger condition has occurred that is related to an operation of a memory device; and responsive to determining that the trigger condition has occurred, reordering a plurality of error handling mechanisms of an error handling sequence of the memory device based upon an error handling mechanism performance metric, each error handling mechanism specifying operations to be performed by a controller of the memory device to recover an error in the operation of the memory device.

In Example 16, the subject matter of Example 15 optionally includes wherein the error handling mechanism performance metric comprises a latency measurement specifying a length of time each of the plurality of error handling mechanisms takes to execute.

In Example 17, the subject matter of Example 16 optionally includes wherein the operations of reordering the plurality of error handling mechanisms of an error handling sequence based upon an error handling mechanism performance metric comprises reordering the plurality of error handling mechanisms of an error handling sequence based upon both the latency and a failure rate for each of the plurality of error handling mechanisms.

In Example 18, the subject matter of Example 17 optionally includes wherein the operations of reordering the error handling sequence comprises: for each particular one of the plurality of error handling mechanisms: calculating a failure rate of the particular one of the plurality of error handling mechanisms; and determining a score of the particular one of the plurality of error handling mechanisms by multiplying the failure rate by a corresponding latency of the particular one of the plurality of error handling mechanisms; and reordering the error handling sequence by ordering the plurality of error handling mechanisms in order of increasing score such that a lowest scoring error handling mechanism is performed first.

In Example 19, the subject matter of any one or more of Examples 15-18 optionally include wherein the operations further comprise: subsequent to reordering the error handling sequence, determining that an error has occurred reading a value from a memory of the memory device; and applying ones of the plurality of error handling mechanisms in the sequence specified by the error handling sequence until either the error is corrected or until it is determined that the error is uncorrectable.

In Example 20, the subject matter of Example 19 optionally includes wherein the operations further comprise: determining that a particular one of the plurality of error handling mechanisms corrected the error; and in response, incrementing a counter corresponding to the particular one of the plurality of error handling mechanisms.

In Example 21, the subject matter of any one or more of Examples 15-20 optionally include wherein the trigger condition is a number of times that the error handling sequence is utilized.

Example 22 is a memory device comprising: means for determining that a trigger condition has occurred that is related to an operation of the memory device; and means for reordering a plurality of error handling mechanisms of an error handling sequence based upon an error handling mechanism performance metric responsive to determining that the trigger condition has occurred, each error handling mechanism specifying operations to be performed by a controller to recover an error in the operation of the memory device.

In Example 23, the subject matter of Example 22 optionally includes wherein the error handling mechanism performance metric comprises a latency measurement specifying a length of time each of the plurality of error handling mechanisms takes to execute.

In Example 24, the subject matter of Example 23 optionally includes wherein the means for reordering the plurality of error handling mechanisms of an error handling sequence based upon an error handling mechanism performance metric comprises means for reordering the plurality of error handling mechanisms of an error handling sequence based upon both the latency and a failure rate for each of the plurality of error handling mechanisms.

In Example 25, the subject matter of Example 24 optionally includes wherein reordering the error handling sequence comprises: for each particular one of the plurality of error handling mechanisms: means for calculating a failure rate of the particular one of the plurality of error handling mechanisms; and means for determining a score of the particular one of the plurality of error handling mechanisms by multiplying the failure rate by a corresponding latency of the particular one of the plurality of error handling mechanisms; and means for reordering the error handling sequence by ordering the plurality of error handling mechanisms in order of increasing score such that a lowest scoring error handling mechanism is performed first.

In Example 26, the subject matter of any one or more of Examples 22-25 optionally include subsequent to reordering the error handling sequence, means for determining that an error has occurred reading a value from a memory of the memory device; and means for applying ones of the plurality of error handling mechanisms in the sequence specified by the error handling sequence until either the error is corrected or until it is determined that the error is uncorrectable.

In Example 27, the subject matter of Example 26 optionally includes means for determining that a particular one of the plurality of error handling mechanisms corrected the error; and in response, means for incrementing a counter corresponding to the particular one of the plurality of error handling mechanisms.

In Example 28, the subject matter of any one or more of Examples 22-27 optionally include wherein the trigger condition is a number of times that the error handling sequence is utilized.

The invention claimed is:

1. A system comprising:
a memory device; and
a processing device, operatively coupled to the memory device, the processing device configured to perform operations comprising:
applying an ordered error handling sequence of a plurality of error handling mechanisms in response to each of a number of errors, each error handling mechanism in the plurality of error handling mechanisms specifying operations to be performed to correct an error in an operation performed on the memory device;
incrementing a counter for each error the ordered error handling sequence is applied to;
determining, based on latencies incurred by the applications of the ordered error handling sequence to the errors, that the latencies are trending upward over a predetermined period of time;

in response to the counter satisfying a threshold and the determination that the latencies are trending upward over the predetermined period of time:
reordering the plurality of error handling mechanisms of the ordered error handling sequence based on an error handling mechanism performance metric for each of the plurality of error handling mechanisms; and
resetting the counter.

2. The system of claim 1, wherein the latency incurred by each application of the ordered error handling sequence to an error is a length of time that the ordered error handling sequence takes to correct the error.

3. The system of claim 2, wherein the reordering of the plurality of error handling mechanisms is further based on the latency incurred by each application of the ordered error handling sequence and a failure rate of each of the error handling mechanisms in the plurality of error handling mechanisms.

4. The system of claim 3, wherein the reordering of the plurality of error handling mechanisms of the ordered error handling sequence comprises:
for each particular error handling mechanism in the plurality of error handling mechanisms:
calculating the failure rate of the particular error handling mechanism;
determining a score of the particular error handling mechanism by multiplying the failure rate of the particular error handling mechanism by a corresponding latency of the particular error handling mechanism; and
reordering the plurality of error handling mechanisms of the ordered error handling sequence by ordering the plurality of error handling mechanisms in order of increasing score such that a lowest scoring error handling mechanism is performed first.

5. The system of claim 1, wherein the operations further comprise:
subsequent to reordering the plurality of error handling mechanisms of the ordered error handling sequence, determining that a memory-read error has occurred reading a value from the memory device; and
applying error or handling mechanisms in the plurality of error handling mechanisms in the ordered error handling sequence until either the memory-read error is corrected or it is determined that the memory-read error is uncorrectable.

6. The system of claim 5, wherein the operations further comprise:
determining that a particular error handling mechanism in the plurality of error handling mechanisms corrected the memory-read error; and
in response, incrementing a counter corresponding to the particular error handling mechanism.

7. The system of claim 1, wherein the reordering of the plurality of error handling mechanisms is further in response to determining that the number of errors exceeds a second predetermined threshold.

8. The system of claim 1, wherein the applying of the ordered error handling sequence in response to a first error of the number of errors comprises:
performing the error handling mechanisms in the plurality of error handling mechanisms of the ordered error handling sequence in the order of the sequence until either the first error in the operation performed on the memory device is corrected or all of the error handling mechanisms in the plurality of error handling mechanisms have been performed.

9. The system of claim 1, wherein the ordered error handling sequence comprises pointers to executable code for performing the error handling mechanisms in the plurality of error handling mechanisms.

10. A method comprising:
applying an ordered error handling sequence of a plurality of error handling mechanisms in response to each of a number of errors, each error handling mechanism in the plurality of error handling mechanisms specifying operations to be performed to correct an error in an operation performed on a memory device;
incrementing a counter for each error the ordered error handling sequence is applied to;
determining, based on latencies incurred by the applications of the ordered error handling sequence to the errors, that the latencies are trending upward over a predetermined period of time; and
in response to the counter satisfying a threshold and the determination that the latencies are trending upward over the predetermined period of time:
reordering the plurality of error handling mechanisms of the ordered error handling sequence based on an error handling mechanism performance metric for each of the plurality of error handling mechanisms; and
resetting the counter.

11. The method of claim 10, wherein the error handling mechanism performance metric comprises a latency measurement specifying a length of time that each of the error handling mechanisms in the plurality of error handling mechanisms takes to execute.

12. The method of claim 11, wherein the reordering of the plurality of error handling mechanisms is based on the latency measurement and a failure rate of each of the error handling mechanisms in the plurality of error handling mechanisms.

13. The method of claim 12, wherein the reordering of the plurality of error handling mechanisms of the ordered error handling sequence comprises:
for each particular error handling mechanism in the plurality of error handling mechanisms:
calculating the failure rate of the particular error handling mechanism;
determining a score of the particular error handling mechanism by multiplying the failure rate of the particular error handling mechanism by a corresponding latency of the particular error handling mechanism; and
reordering the plurality of error handling mechanisms of the ordered error handling sequence by ordering the plurality of error handling mechanisms in order of increasing score such that a lowest scoring error handling mechanism is performed first.

14. The method of claim 10, further comprising:
subsequent to reordering the plurality of error handling mechanisms of the ordered error handling sequence, determining that a memory-read error has occurred reading a value from the memory device; and
applying error handling mechanisms in the plurality of error handling mechanisms in the ordered error handling sequence until either the memory-read error is corrected or it is determined that the memory-read error is uncorrectable.

15. The method of claim 14, further comprising:
determining that a particular error handling mechanism in the plurality of error handling mechanisms corrected the memory-read error; and
in response, incrementing a counter corresponding to the particular error handling mechanism.

16. The method of claim 10, wherein the reordering of the plurality of error handling mechanisms is further in response to determining that the number of errors exceeds a second predetermined threshold.

17. The method of claim 10, wherein the applying of the ordered error handling sequence in response to a first error of the number of errors comprises:
performing the error handling mechanisms in the plurality of error handling mechanisms of the ordered error handling sequence in the order of the sequence until either the first error in the operation performed on the memory device is corrected or all of the error handling mechanisms in the plurality of error handling mechanisms have been performed.

18. The method of claim 10, wherein the ordered error handling sequence comprises pointers to executable code for performing the error handling mechanisms in the plurality of error handling mechanisms.

19. A non-transitory machine-readable medium comprising instructions that, when performed by a machine, cause the machine to perform operations comprising:
applying an ordered error handling sequence of a plurality of error handling mechanisms in response to each of a number of errors, each error handling mechanism in the plurality of error handling mechanisms specifying operations to be performed to correct an error in an operation performed on a memory device;
incrementing a counter for each error the ordered error handling sequence is applied to;
determining, based on latencies incurred by the applications of the ordered error handling sequence to the errors, that the latencies are trending upward over a predetermined period of time; and
in response to the counter satisfying a threshold and the determination that the latencies are trending upward over the predetermined period of time:
reordering the plurality of error handling mechanisms of the ordered error handling sequence based on an error handling mechanism performance metric for each of the plurality of error handling mechanisms; and
resetting the counter.

20. The non-transitory machine-readable medium of claim 19, wherein the error handling mechanism performance metric comprises a latency measurement specifying a length of time that each of the error handling mechanisms in the plurality of error handling mechanisms takes to execute.

21. The non-transitory machine-readable medium of claim 20, wherein reordering the plurality of error handling mechanisms is based on the latency measurement and a failure rate of each of the error handling mechanisms in the plurality of error handling mechanisms.

22. The non-transitory machine-readable medium of claim 21, wherein the reordering of the plurality of error handling mechanisms of the ordered error handling sequence comprises:
for each particular error handling mechanism in the plurality of error handling mechanisms:
calculating the failure rate of the particular error handling mechanism;
determining a score of the particular error handling mechanism by multiplying the failure rate of the particular error handling mechanism by a corresponding latency of the particular error handling mechanism; and
reordering the plurality of error handling mechanisms of the ordered error handling sequence by ordering the plurality of error handling mechanisms in order of increasing score such that a lowest scoring error handling mechanism is performed first.

23. The non-transitory machine-readable medium of claim 19, wherein the operations further comprise:
subsequent to reordering the plurality of error handling mechanisms of the ordered error handling sequence, determining that a memory-read error has occurred reading a value from the memory device; and
applying error handling mechanisms in the plurality of error handling mechanisms in the ordered error handling sequence until either the memory-read error is corrected or it is determined that the memory-read error is uncorrectable.

24. The non-transitory machine-readable medium of claim 23, wherein the operations further comprise:
determining that a particular error handling mechanism in the plurality of error handling mechanisms corrected the memory-read error; and
in response, incrementing a counter corresponding to the particular error handling mechanism.

25. The non-transitory machine-readable medium of claim 19, wherein the applying of the ordered error handling sequence in response to a first error of the number of errors comprises:
performing the error handling mechanisms in the plurality of error handling mechanisms of the ordered error handling sequence in the order of the sequence until either the first error in the operation performed on the memory device is corrected or all of the error handling mechanisms in the plurality of error handling mechanisms have been performed.

26. The non-transitory machine-readable medium of claim 19, wherein the ordered error handling sequence comprises pointers to executable code for performing the error handling mechanisms in the plurality of error handling mechanisms.

* * * * *